United States Patent
Swanson

(10) Patent No.: US 9,001,599 B2
(45) Date of Patent: Apr. 7, 2015

(54) SYSTEMS AND METHODS FOR DQS GATING

(75) Inventor: Ross Swanson, Lyons, CO (US)

(73) Assignee: Marvell World Trade Ltd., St. Michael (BB)

( * ) Notice: Subject to any disclaimer, the term of this patent is extended or adjusted under 35 U.S.C. 154(b) by 382 days.

(21) Appl. No.: 13/487,737

(22) Filed: Jun. 4, 2012

(65) Prior Publication Data

US 2012/0324193 A1    Dec. 20, 2012

Related U.S. Application Data

(60) Provisional application No. 61/496,965, filed on Jun. 14, 2011, provisional application No. 61/540,142, filed on Sep. 28, 2011.

(51) Int. Cl.
*G11C 7/00* (2006.01)
*G06F 13/16* (2006.01)
*G11C 7/02* (2006.01)
*G11C 7/04* (2006.01)
*G11C 11/4076* (2006.01)
*G11C 7/10* (2006.01)
*G11C 7/22* (2006.01)

(52) U.S. Cl.
CPC .............. *G06F 13/1689* (2013.01); *G11C 7/02* (2013.01); *G11C 7/04* (2013.01); *G11C 11/4076* (2013.01); *G11C 7/1066* (2013.01); *G11C 7/222* (2013.01)

(58) Field of Classification Search
CPC .................................. G11C 8/18; G11C 7/106
USPC ........................... 365/193, 191, 233.1, 233.13
See application file for complete search history.

(56) References Cited

U.S. PATENT DOCUMENTS

| | | | |
|---|---|---|---|
| 6,085,345 A * | 7/2000 | Taylor | 714/731 |
| 6,600,681 B1 | 7/2003 | Korger et al. | |
| 7,215,584 B2 | 5/2007 | Butt et al. | |
| 7,911,857 B1 | 3/2011 | Venkataraman et al. | |
| 2001/0043505 A1 | 11/2001 | Lee et al. | |
| 2004/0123173 A1 | 6/2004 | Emberling et al. | |
| 2004/0260865 A1 | 12/2004 | Srinivas et al. | |
| 2007/0002642 A1 | 1/2007 | Butt et al. | |
| 2009/0161452 A1 * | 6/2009 | Wang et al. | 365/193 |

OTHER PUBLICATIONS

Elpida User's Manual. "How to Use DDR SDRAM", Published Aug. 2007, Japan, Document No. E0234E50 (Ver. 5.0).

"Memory Made Easy DDR2/3 Analysis", Ansoft Korean Team, undated.

International Preliminary Report on Patentability and Written Opinion dated Jan. 3, 2014 from related/corresponding PCT Patent Application No. PCT/US2012/040710.

PCT Notification of Transmittal of the International Search Report and the Written Opinion of the International Searching Authority for International Application No. PCT/US2012/040710 dated Oct. 17, 2012 (9 pages).

* cited by examiner

*Primary Examiner* — Han Yang

(57) ABSTRACT

Systems and methods are provided for timing read operations with a memory device. A system for timing read operations with a memory device includes a gating circuit configured to receive a timing signal from the memory device. The gating circuit is further configured to pass through the timing signal as a filtered timing signal during a gating window. The gating window is generated by the gating circuit based on a control signal. The system further includes a timing control circuit configured to generate the control signal after receiving a read request from a memory controller. The timing control circuit is further configured to adjust the control signal to account for temporal variations in the timing signal from the memory device.

20 Claims, 11 Drawing Sheets

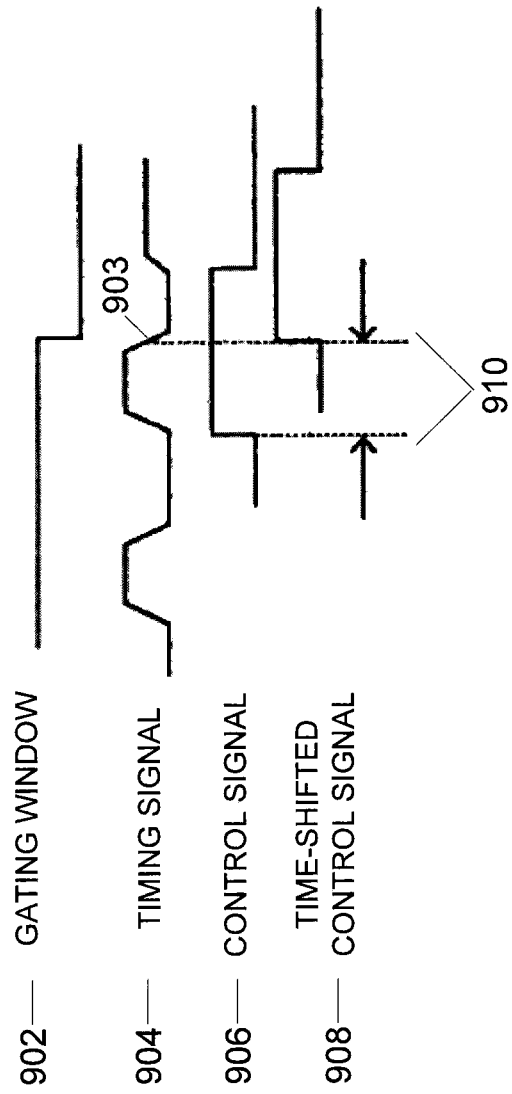

EARLY CONTROL SIGNAL MAY ALLOW TRI-STATE GLITCHES
INTO MEMORY CONTROLLER

1004 — GATING WINDOW
1006 — TIMING SIGNAL
1002 — EARLY CONTROL SIGNAL

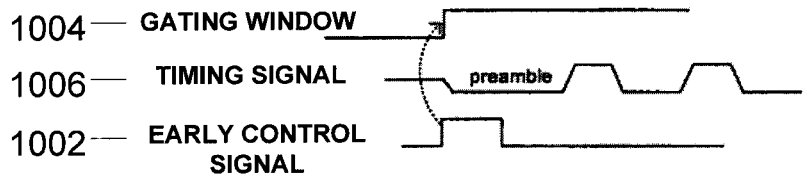

LATE CONTROL SIGNAL MAY CLIP TIMING SIGNAL EDGE,
REDUCING READ EYE MARGIN

1010 — GATING WINDOW
1012 — TIMING SIGNAL
1008 — LATE CONTROL SIGNAL

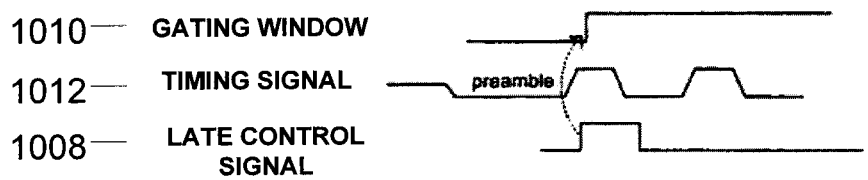

FIG. 10A

INCORRECT CLOSURE OF GATING WINDOW MAY ALLOW
TRI-STATE REGION TO ENTER MEMORY CONTROLLER

1022 — GATING WINDOW
1014 — TIMING SIGNAL
1018 — EARLY CONTROL SIGNAL

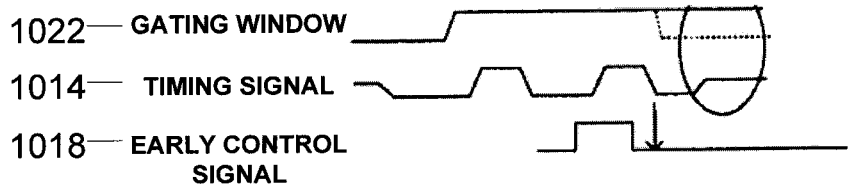

1024 — GATING WINDOW
1016 — TIMING SIGNAL
1020 — LATE CONTROL SIGNAL

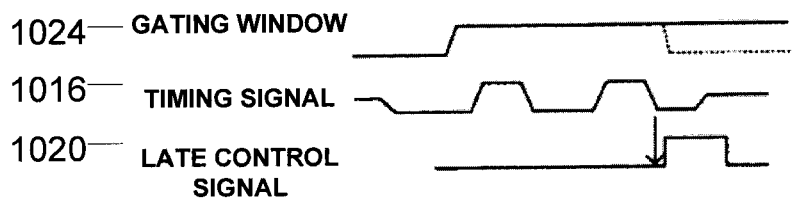

FIG. 10B

SYSTEMS AND METHODS FOR DQS GATING

CROSS-REFERENCE TO RELATED APPLICATIONS

This application claims priority to U.S. Provisional Patent Application No. 61/496,965, filed Jun. 14, 2011, entitled "Gateon Open Detect and Track," and to U.S. Provisional Patent Application No. 61/540,142, filed Sep. 28, 2011, entitled "Gateon Window Close Detect and Track," both of which are herein incorporated in their entirety.

TECHNICAL FIELD

The technology described herein relates generally to a memory controller and more particularly to a self-adjusting system configured to gate a timing signal to perform a read operation with a memory device.

BACKGROUND

Synchronous Dynamic Random Access Memory (SDRAM) is a type of Random Access Memory (RAM) used in computing devices. SDRAM comprises both single data rate (SDR) SDRAM and double data rate (DDR) SDRAM. SDR SDRAM transfers data during each period of a timing signal in synchronization with a rising edge of the timing signal. By contrast, DDR SDRAM can achieve nearly twice the bandwidth of SDR SDRAM by transferring data on both rising and falling edges of a timing signal.

To transfer data from an SDRAM memory module to a memory controller, the memory controller may initiate a read operation by issuing a read request to the memory module. After a period of time has elapsed, the memory module may respond by transmitting a data signal along with a timing signal (e.g., DQ data signal and DQS data strobe signal) to the memory controller. In some systems, the timing signal undergoes a filtering operation prior to receipt at the memory controller to eliminate signal noise and/or undesirable regions of the timing signal. In response to receiving the timing signal, the memory controller may read the data signal and store data by registering data on rising and/or falling edges of the timing signal.

Due to clock jitter and/or changes in temperature or voltage that may occur in the system, the response from the memory module may require a variable amount of time. If a filtering operation is to be performed on the timing signal prior to its receipt at the memory controller, the variable nature of the memory module's response may be problematic. For example, a filtering element that is configured to operate at a static, pre-determined time interval following the read request may be unable to compensate for the variable nature of the timing signal, causing an incorrect filtering operation. The incorrect filtering operation may result in erroneous data read operations, which may lead to a variety of problems, including a reduction of system performance and/or data corruption in the memory controller.

The description above is presented as a general overview of related art in this field and should not be construed as an admission that any of the information it contains constitutes prior art against the present patent application.

SUMMARY

The present disclosure is directed to systems and methods for timing read operations with a memory device. In one embodiment, a system for timing read operations with a memory device includes a gating circuit configured to receive a timing signal from the memory device. The gating circuit is further configured to pass through the timing signal as a filtered timing signal during a gating window. The gating window is generated by the gating circuit based on a control signal. The system further includes a timing control circuit configured to generate the control signal after receiving a read request from a memory controller. The timing control circuit is further configured to adjust the control signal to account for temporal variations in the timing signal from the memory device. In one embodiment, the temporal variations in the timing signal are based on clock jitter or changes in temperature or voltage in the system. In another embodiment, the timing signal is a DQS strobe signal, and the gating window is configured to eliminate tri-state regions of the DQS strobe signal in the filtered timing signal. The control signal is an open signal or a close signal configured to cause the gating window to open or close, respectively, In one embodiment, the system further includes a feedback circuit. The feedback circuit includes the timing control circuit and a phase detector circuit configured to receive the filtered timing signal and the control signal as inputs and to send a phase detect output value to the timing control circuit. In one embodiment, the phase detector circuit includes a D-type flip flop. In another embodiment, the feedback circuit is a closed-loop, self-adjusting system that automatically adjusts a timing of the control signal by tracking a timing of a rising edge or a falling edge of the timing signal. The timing of the control signal is adjusted to temporally align the control signal with the rising edge or the falling edge of the timing signal.

In one embodiment, the timing control circuit comprises a signal generator configured to generate the control signal after receiving the read request and a delay module configured to control a timing of the control signal based on a delay value held by a counter. The counter is configured to increment or decrement the delay value based on the phase detect output value received from the phase detector circuit. In one embodiment, the signal generator is a pulse generator, and the control signal is a pulse signal.

In another embodiment, the gating circuit includes a D-type flip flop configured to receive the control signal and to output the gating window based on a timing of the control signal. The gating circuit further includes an "AND" gate configured to receive the gating window and the timing signal as inputs and to output the filtered timing signal.

The present disclosure is also directed to a method for timing read operations with a memory device. The method includes receiving a timing signal from the memory device at a gating circuit. The method further includes generating a control signal at a timing control circuit after receiving a read request from a memory controller. The timing control circuit is configured to adjust the control signal to account for temporal variations in the timing signal. The method also includes passing the timing signal through the gating circuit as a filtered timing signal during a gating window. The gating window is generated by the gating circuit based on the control signal.

BRIEF DESCRIPTION OF THE FIGURES

FIG. 9 depicts signal timing diagrams for a circuit using a control signal pulse with a width of one full clock cycle.

FIGS. 10A and 10B depict signal timing diagrams illustrating problems caused by early and late control signals.

DETAILED DESCRIPTION

Figure 1:
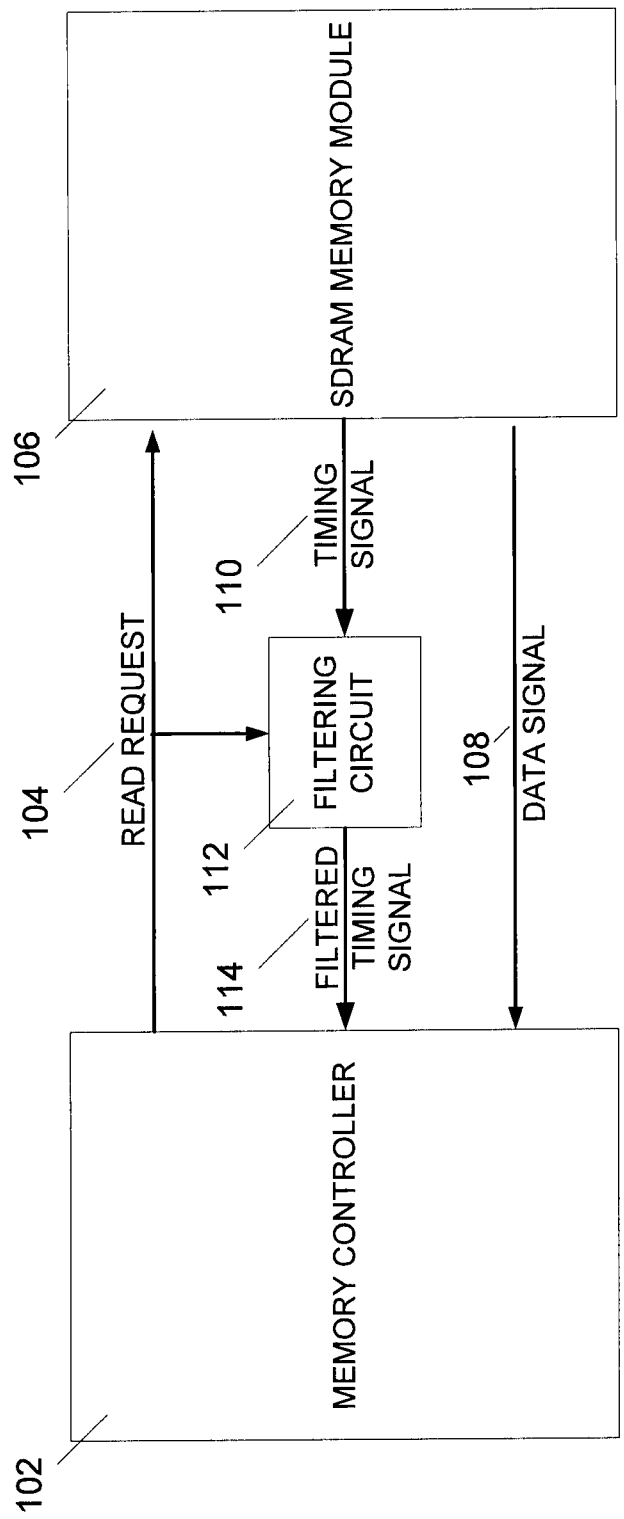
FIG. 1 is a block diagram illustrating a read operation performed between a memory controller and an SDRAM memory module.

FIG. 1 is a block diagram illustrating a read operation performed between a memory controller 102 and an SDRAM memory module 106. The read operation may be initiated with the memory controller 102 sending a read request 104 to the memory module 106, requesting to read data from a particular address in memory. The memory controller 102 may comprise, for example, a microcontroller or a system on a chip (SOC). The memory module 106 may respond to the read request 104 by outputting both a data signal bus 108 and a timing signal 110. The data signal bus 108 and timing signal 110 may include, for example, a DQ signal and a DQS data strobe signal, respectively. The timing signal 110 is used to inform the memory controller 102 that the data signal 108 is ready to be received and to notify the memory controller 102 of the particular timing of the data signal 108.

Figure 2:
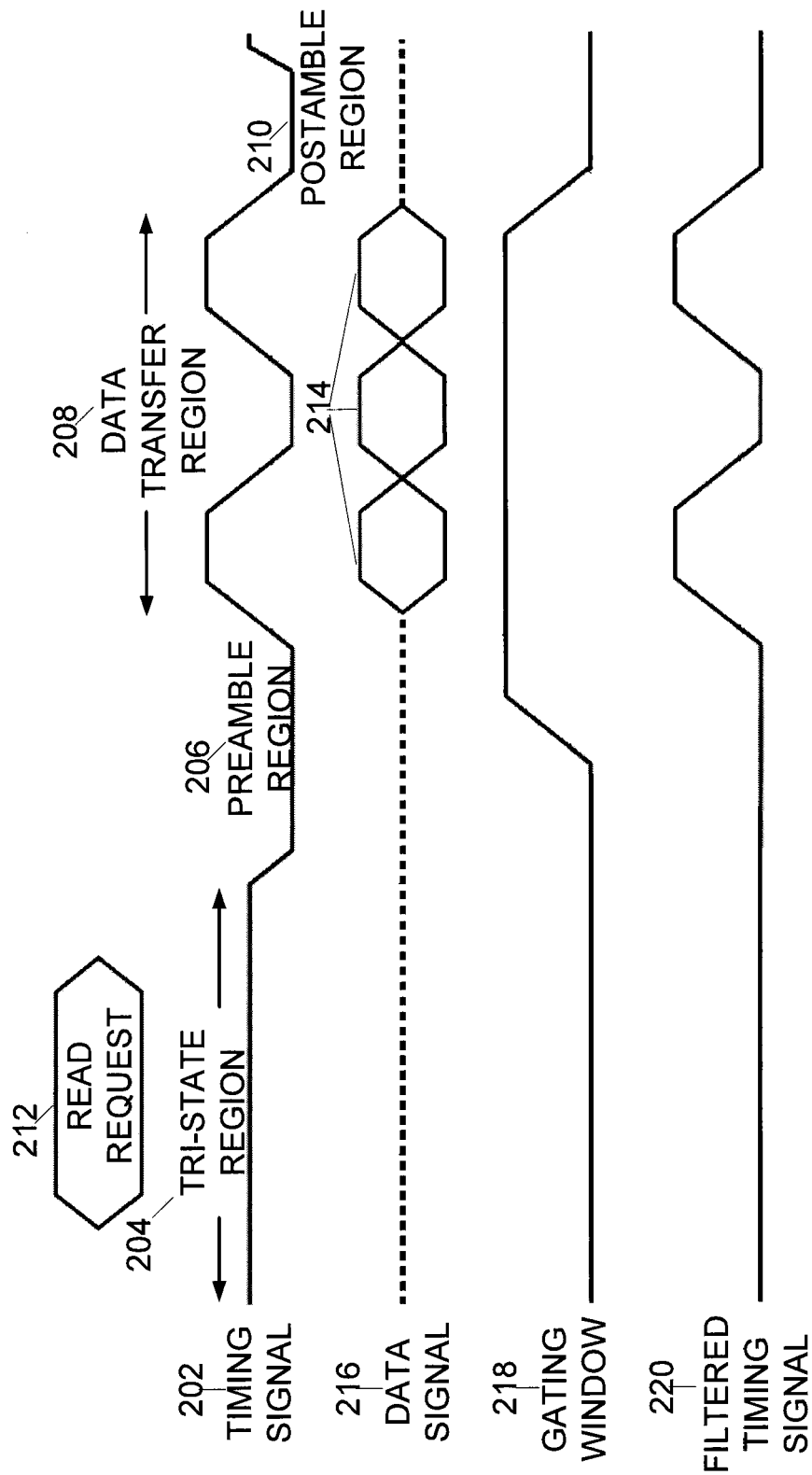
FIG. 2 depicts signals used in performing a read operation between a memory controller and an SDRAM memory module.

FIG. 2 depicts signals used in performing a read operation between a memory controller and an SDRAM memory module. As illustrated in FIG. 2, a timing signal 202 may contain four distinct regions: a tri-state region 204, a preamble region 206, a data transfer region 208, and a postamble region 210. Prior to the memory module's receipt of a read request 212, the timing signal 202 exists in a high impedance state, denoted by the tri-state region 204. While operating in the tri-state region 204, the timing signal 202 is of an indeterminate value, neither logic level high nor logic level low. After receiving the read request 212, the timing signal 202 shifts to a logic level low preamble region 206, approximately one clock cycle prior to the data transfer region 208. In order to transfer packets of data 214 within a data signal 216 between the memory module 106 and the memory controller 102, the timing signal 202 enters the data transfer region 208. While operating in this region, the timing signal 202 toggles between logic level high and logic level low values. The memory controller 102 uses the toggling timing signal 202 as a reference signal and may read in the data signal 216 on rising edges and/or falling edges of the timing signal 202. Following the data transfer region 208 and prior to re-entering a subsequent tri-state region, the timing signal 202 enters the logic level low postamble region 210. The transition from the postamble region 210 to the tri-state region may occur one half clock cycle after the last edge of valid data within the data transfer region 208.

With reference again to FIG. 1, a filtering circuit 112 may be employed to enable more reliable read operations. Rather than transmitting the timing signal 110 directly from the memory module 106 to the memory controller 102, the timing signal 110 may instead be routed through the filtering circuit 112 to eliminate signal noise and/or to remove portions of the timing signal 110 that could lead to an erroneous data read operation. Thus, after receiving the read request 104, the filtering circuit 112 may generate a gating window to act as a filter for the timing signal 110. A filtered timing signal 114, allowed to pass through the open gating window of the filtering circuit 112, may be received by the memory controller 102.

As illustrated in FIG. 2, gating window 218 may be opened during the preamble region 206 of the timing signal 202 and closed following a last falling edge of the data transfer region 208. The gating window 218 may be used to filter noise from the timing signal 202 and/or to ensure that the tri-state region 204 of the timing signal 202 is not read by the memory controller. Thus, a filtered timing signal 220, as illustrated in FIG. 2, may contain only the data transfer region 208 of the timing signal 202 and may otherwise remain at a logic level low, removing the tri-state regions that exist prior to and following the transmission of data. Eliminating the tri-state regions in the filtered timing signal 220 may prevent glitches that can occur if the tri-state region 204 is allowed to be read by the memory controller (e.g., interpreting the tri-state region 204 as a false timing signal edge).

Figure 3:
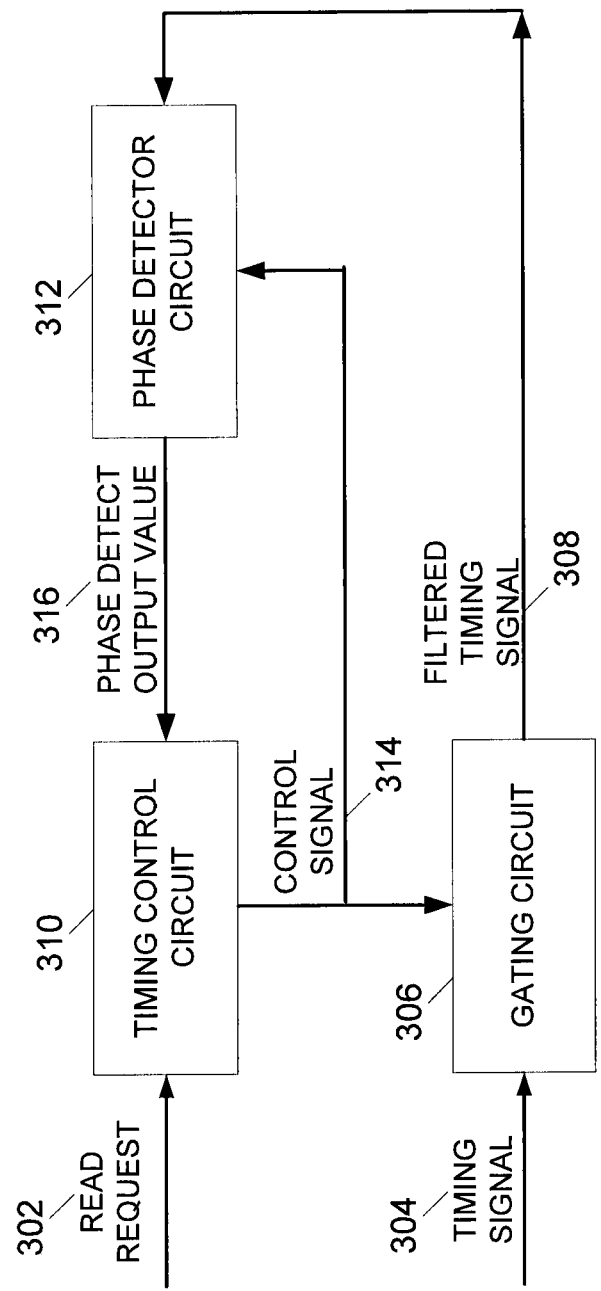
FIG. 3 is a block diagram depicting a self-adjusting, closed-loop feedback system for timing a read operation between a memory controller and a memory module.

FIG. 3 is a block diagram depicting a self-adjusting, closed-loop feedback system for timing a read operation between a memory controller and a memory module. As noted above with respect to FIG. 1, a read operation includes, generally, a transmission of a read request 302 from the memory controller to the memory module, and the memory module's response comprises a data signal and a timing signal 304 (e.g., DQ and DQS data strobe signals). As is also noted above with respect to FIG. 1, it may be desirable to filter out particular regions of the timing signal 304 before allowing it to enter the memory controller. To perform this filtering, a gating circuit 306 is used. The gating circuit 306 is configured to receive the timing signal 304 from the memory module and to pass through the timing signal 304 as a filtered timing signal 308 during a gating window. The filtered timing signal 308 may be received by the memory controller (not shown).

Figure 4:
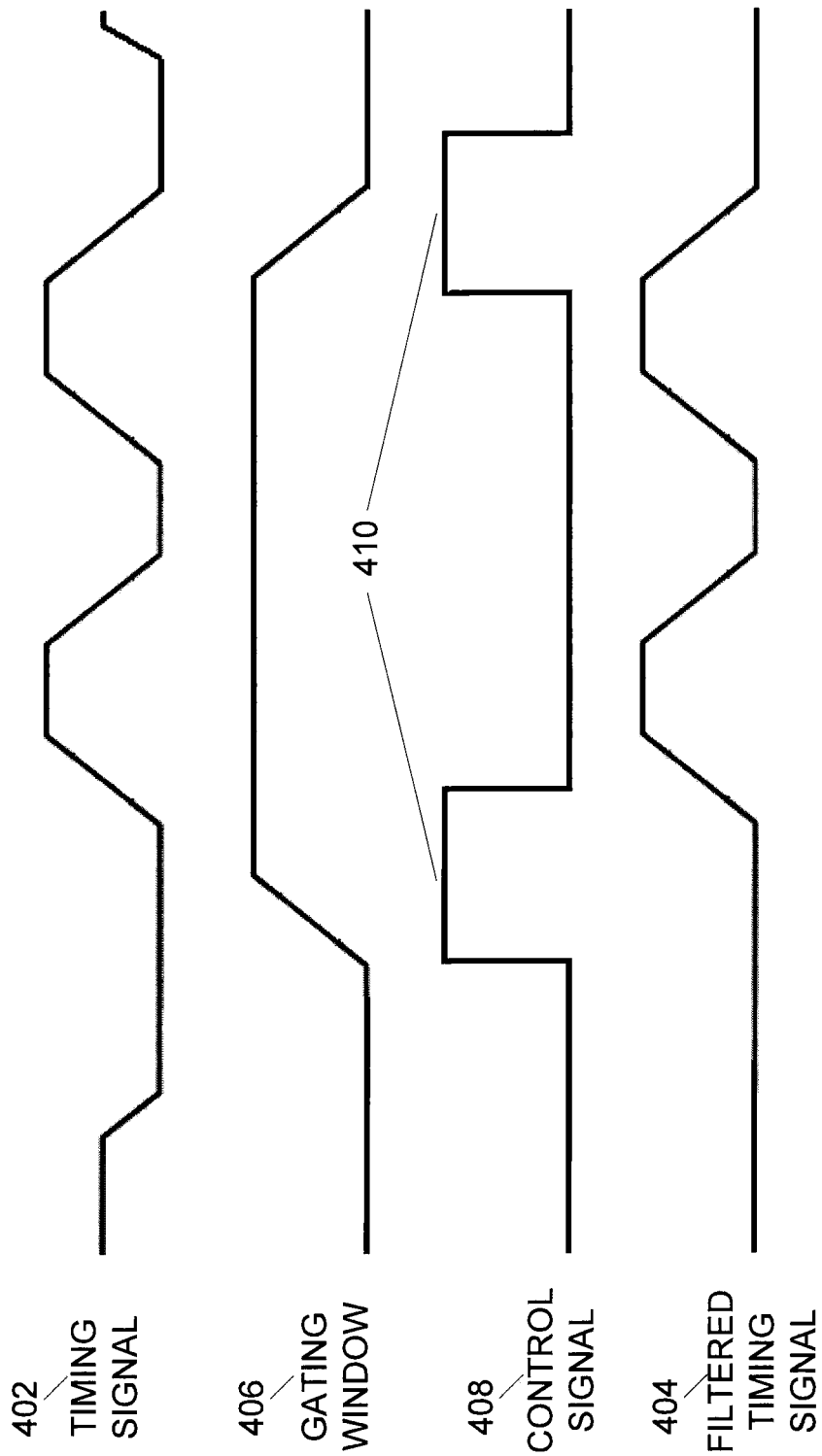
FIG. 4 depicts examples of signals used by a self-adjusting, closed-loop feedback system in timing a read operation between a memory controller and a memory module.

FIG. 4 depicts examples of signals used by a self-adjusting, closed-loop feedback system in timing a read operation between a memory controller and a memory module. A timing signal 402 sent from the memory module contains the four regions (tri-state, preamble, data transfer, postamble) noted above with reference to the timing signal 202 of FIG. 2. A filtered timing signal 404, allowed to pass through the gating circuit 306 of FIG. 3, may be similar to the original timing signal 402, except that tri-state regions have been removed. The filtering operation of the gating circuit 306 is performed by the gating window 406, which allows the timing signal 402 to pass through the gating circuit 306 as the filtered timing signal 404 only when the gating window 406 is in a high, open state. To ensure that the tri-state regions are removed in the filtered timing signal 404, the gating window 406 may be opened during the preamble region of the timing signal 402 and closed following a last falling edge of the timing signal 402, as illustrated in FIG. 4.

Clock jitter and changes in temperature and voltage within the system may result in temporal variations in the timing signal 402. Thus, use of static timing methods to open and close the gating window 406 may result in incorrect filtering of the timing signal 402. For example, a gating window 406 configured to open and close at pre-determined points in time following the read request may result in a filtered timing signal 404 containing portions of the tri-state region or a clipping of valid rising and falling edges in the filtered timing signal 404.

To accommodate clock jitter and changes in temperature and voltage in the system, a closed-loop, self-adjusting feedback system may be used to track temporal variations in the timing signal 304. As illustrated in FIG. 3, the feedback system consists of a timing control circuit 310 and a phase detector circuit 312. The timing control circuit 310 is configured to generate a control signal 314 after receiving the read request 302 from the memory controller. The control signal 314 is sent to the gating circuit 306, where it is used to open and close the gating window 406 of the gating circuit 306. Based on information received from the feedback system regarding temporal variations in the timing signal 304, the timing control circuit 310 may delay propagation of the control signal 314 to account for these temporal variations. As illustrated in FIG. 4, the control signal 408 may include one or more pulses 410, which are used to instruct the gating window 406 to open or close.

To enable the feedback system of FIG. 3, the timing control circuit 310 transmits the control signal 314 to the phase detector circuit 312. The phase detector circuit 312 is configured to receive the control signal 314 and the filtered timing signal 308 as inputs and to generate a phase detect output value 316 based on a timing of the control signal 314 with reference to the filtered timing signal 308. The phase detect output value 316 thus indicates whether the control signal 314 is too early or too late, with reference to the filtered timing signal 308. The phase detect output value 316 is received by the timing control circuit 310 and may be used to adjust a timing of a control signal issued as a result of a subsequent read request.

For example, upon receiving a first read request, the timing control circuit 310 generates a first control signal, which is sent to the gating circuit 306 and to the phase detector circuit 312. The gating circuit 306 uses the first control signal to generate the gating window 406 and allows the timing signal 402 to pass through the open gating window 406 as the filtered timing signal 404. The phase detector circuit 312, receiving both the first control signal and the filtered timing signal 308, may determine, for example, that the first control signal was too early with reference to the filtered timing signal 308. The phase detect output value 316 is sent to the timing control circuit 310 and instructs the timing control circuit 310 to delay propagation of a next control signal generated. Upon receipt of a second read request, the timing control circuit 310 will delay propagation of a second control signal, as instructed by the phase detect output value 316. If the delay value results in the second control signal being too late, the phase detect output value 316 will instruct the timing control circuit 310 to use a smaller delay value in a next iteration. The smaller delay value may result in a subsequent control signal being too early, which may cause the timing control circuit 310 to again delay propagation of a next control signal generated. The feedback loop thus comprises a self-adjusting system that automatically adjusts the timing of the control signal 314 to account for temporal variations in the timing signal 304.

Figure 5:
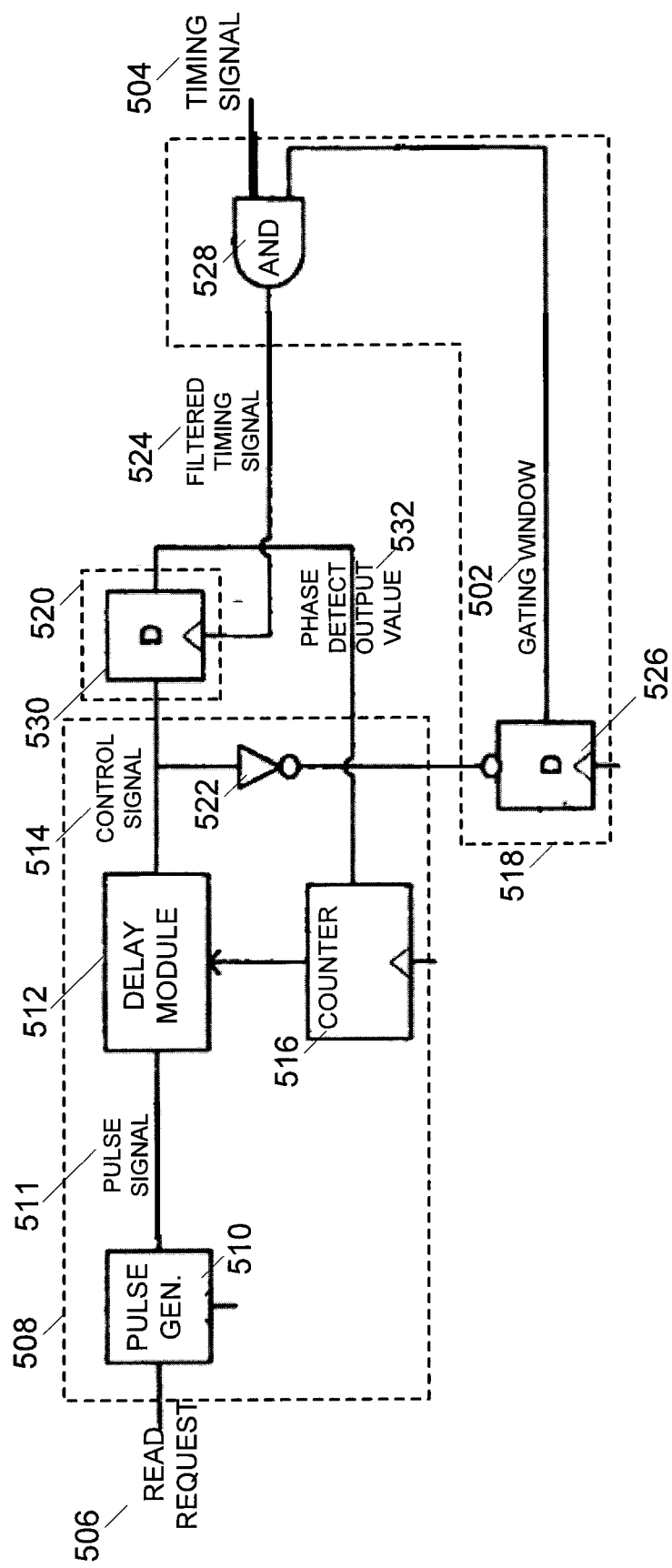
FIG. 5 is a circuit diagram illustrating a circuit configured to track a first rising edge of a timing signal to open a gating window.

FIG. 5 is a circuit diagram illustrating a circuit configured to track a first rising edge of a timing signal to open a gating window. In particular, the circuit of FIG. 5 is configured to open a gating window 502 near a middle of a preamble region of the timing signal 504 in order to filter out a tri-state region of the timing signal 504. As described above, a memory controller initiates a read operation by transmitting a read request 506 to the memory module. As is illustrated in FIG. 5, the read request 506 is also delivered to a timing control circuit 508, and in particular, to a pulse generator 510 of the timing control circuit 508. The pulse generator 510 is configured to generate a pulse signal 511 in response to receiving the read request 506 and to transmit the pulse signal 511 to a delay module 512. The delay module 512 receives the pulse signal 511, and after an amount of time has elapsed, outputs a control signal 514 comprising the delayed pulse signal 511. The amount of time for the delay is determined by a delay value held by a counter 516. The control signal 514 is transmitted to both a gating circuit 518 and to a phase detector circuit 520. In the example of FIG. 5, the control signal 514 is passed through a "NOT" gate 522 prior to receipt at the gating circuit 518.

The gating circuit 518 is configured to open a gating window 502 in response to receiving the control signal 514 and to ultimately output a filtered timing signal 524 using the gating window 502 as a filter. The gating circuit 518 may receive the control signal 514 on a "set" pin of a first D-type flip flop 526. Receipt of the control signal 514 on the set pin causes the gating window output 502 of the first flip flop 526 to switch from a logic level low to a logic level high. The use of the control signal 514 to open and close the gating window 502 can be seen in the gating window 406 of FIG. 4.

Figure 6:
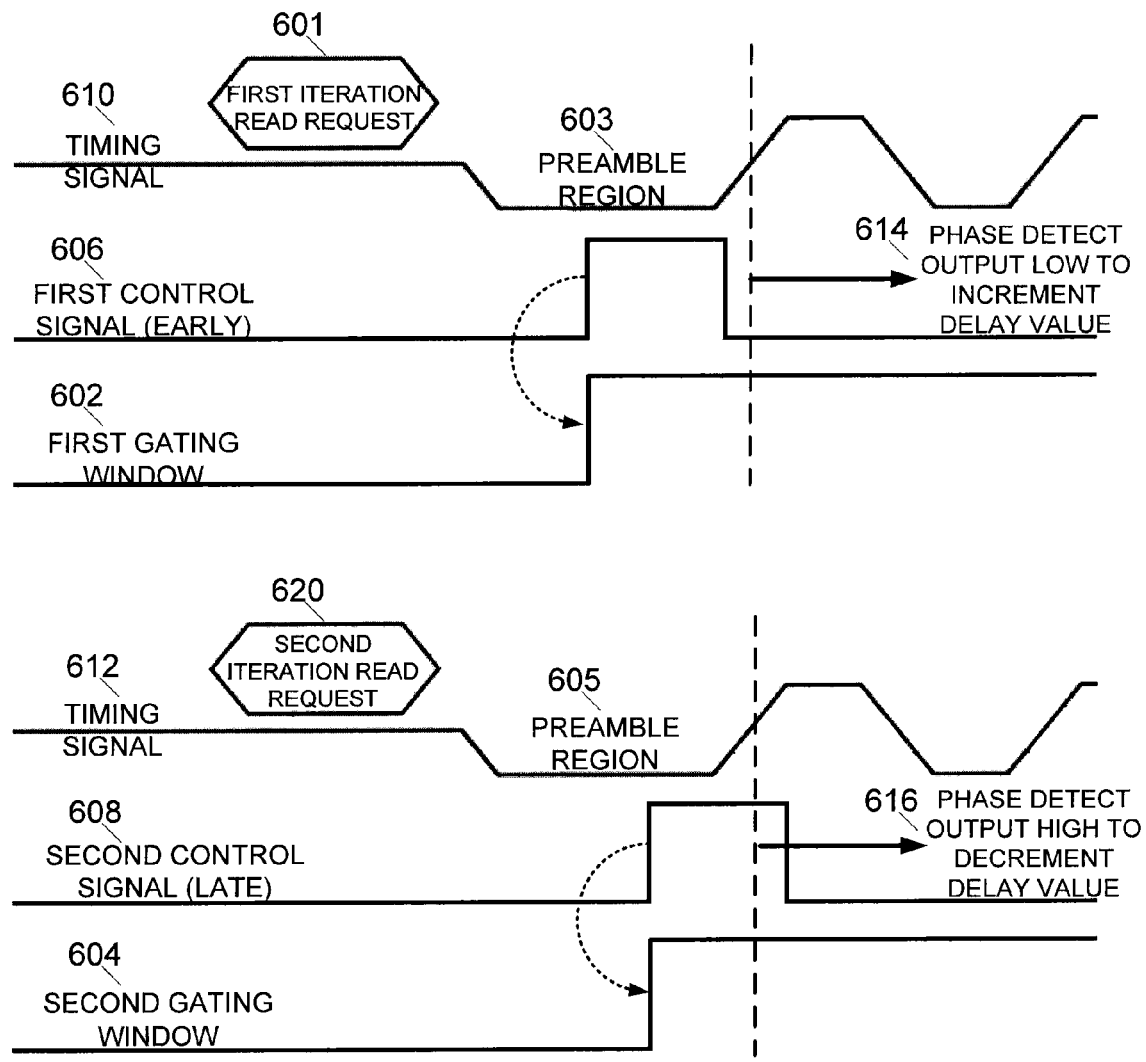
FIG. 6 depicts signals used in example first and second iterations of a circuit configured to track a first rising edge of a timing signal.

FIG. 6 depicts signals used in example first and second iterations of a circuit configured to track a first rising edge of a timing signal. As illustrated, for example, in the first iteration 601 of FIG. 6, timing of a rising edge of a gating window 602 is keyed to a timing of a rising edge of a control signal 606. Further, controlling the timing of the rising edge of the control signal 606 allows the gating window 602 to switch to a logic level high near a middle of a preamble region 603 of a timing signal 610, as may be desirable.

With reference to FIG. 5, the gating window 502 is transmitted to an "AND" gate 528 of the gating circuit 518, where an "AND" operation is performed between the gating window 502 and the timing signal 504. The output of the "AND" gate 528 comprises a filtered timing signal 524, which may be transmitted to a memory controller (not shown). The filtered timing signal 524, as illustrated in FIGS. 2 and 4, may comprise the timing signal 504 with tri-state regions removed.

As noted above, the timing control circuit 508 also transmits the control signal 514 to the phase detector circuit 520, which may comprise a second D-type flip flop 530. The phase detector circuit 520 is configured to receive as inputs the control signal 514 and the filtered timing signal 524 and to output a phase detect output value 532. The phase detect output value 532 is indicative of whether a falling edge of the control signal 514 is early or late with respect to the first rising edge of the filtered timing signal 524. As illustrated in FIG. 6, an early falling edge of control signal 606 may result in a low phase detect output value 614, and a late falling edge of control signal 608 may result in a high phase detect output value 616.

The phase detect output value 532 is sent to the counter 516 of the timing control circuit 508 to create a closed-loop feedback circuit comprising the timing control circuit 508 and the phase detector circuit 520. Based on whether the phase detect output value 532 is high or low, the delay value held by the counter 516 is incremented or decremented. In the example of FIGS. 5 and 6, a low phase detect output value 532 increments the delay value held by the counter 516, and a high phase detect output value 532 decrements the delay value held by the counter 516.

Through this feedback mechanism, the timing control circuit 508 is configured to delay propagation of the control signal 514 so as to track the first rising edge of the timing signal 504. To illustrate this, FIG. 6 depicts example first and second iterations 601, 620 of an operation of the circuit of FIG. 5. In the first iteration 601, a falling edge of a first control signal 606 is early with respect to the first rising edge of the timing signal 610, causing the phase detect output 614 to be low and incrementing the counter's delay value. In a second iteration 620, the incremented delay value causes a second control signal 608 to be late, resulting in a high phase detect output value 616 and a decremented delay value. When the closed loop feedback circuit has caused the falling edge of the control signal to be timed sufficiently close to the first rising edge of the timing signal, the phase detect output value may oscillate between high and low values with each read request. When operating in this locked, oscillating manner, the rising edge of the control signal remains near a center of the preamble region of the timing signal, thus helping to ensure that the gating window is opened near an ideal point in time. Because the circuit is a self-adjusting system, the circuit automatically compensates for temporal changes in the timing signal 504 due to clock jitter and/or changes in temperature or voltage. Further, the self-adjusting system does not require use of a high speed clock to control the gating window, eliminating synchronization problems that may occur if multiple clock domains are used.

Figure 7:
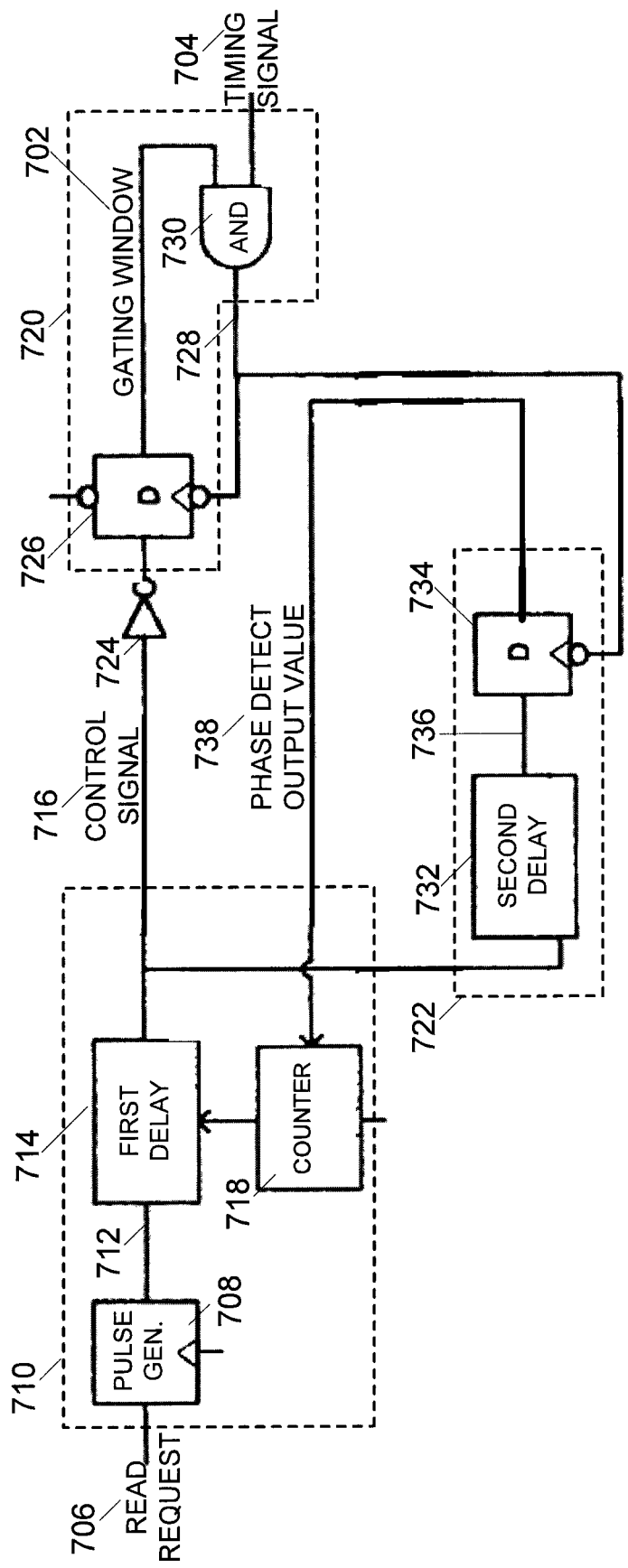
FIG. 7 is a circuit diagram illustrating a circuit configured to track a last falling edge of a timing signal to close a gating window.

FIG. 7 is a circuit diagram illustrating a circuit configured to track a last falling edge of a timing signal to close a gating window. In particular, the circuit of FIG. 7 is configured to close the gating window 702 following the last falling edge of the timing signal 704 in order to filter out a subsequent tri-state region of the timing signal 704. The circuit of FIG. 7 operates in a manner similar to that of the circuit of FIG. 5, with both circuits being configured to track an edge of the timing signal and both circuits utilizing a closed loop feedback system to accomplish this.

In FIG. 7, a read request 706 used to initiate a read operation is delivered to a pulse generator 708 of a timing control circuit 710. The pulse generator 708 is configured to generate a pulse signal 712 in response to receiving the read request 706 and to transmit the pulse signal 712 to a first delay module 714. The first delay module 714 receives the pulse signal 712, and after an amount of time has elapsed, outputs a control signal 716 comprising the delayed pulse signal 712. The amount of time for the delay is determined by a delay value held by a counter 718. The control signal 716 is transmitted both to a gating circuit 720 and to a phase detector circuit 722. In the example of FIG. 7, the control signal 716 is passed through a "NOT" gate 724 prior to receipt at the gating circuit 720.

The gating circuit 720 of FIG. 7 is configured to close a gating window 702 that had previously been opened. For example, the circuit of FIG. 5 may be used to open the gating window 702, while the circuit of FIG. 7 may be used to close the gating window 702 at an end of the read operation. In FIG. 7, the gating circuit 720 may receive the control signal 716 on an input pin of a first D-type flip flop 726. The first D-type flip flop 726 may also receive a filtered timing signal 728 on a clock pin.

Figure 8:
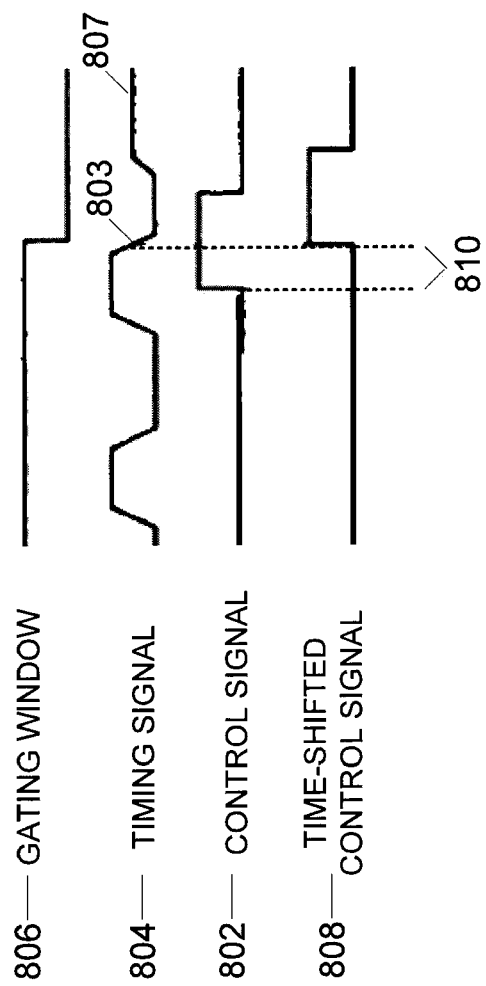
FIG. 8 depicts signals used in a circuit configured to track a last falling edge of a timing signal to close a gating window.

FIG. 8 depicts signals used in a circuit configured to track a last falling edge of a timing signal to close a gating window. As illustrated in FIG. 8, when a control signal 802 occurs contemporaneously with a last falling edge 803 of a timing signal 804, a gating window 806 may be switched from a logic level high to a logic level low. Thus, timing of a falling edge of the gating window 806 is keyed to a timing of the last falling edge 803 of the timing signal 804, enabling the gating window 806 to filter out a subsequent tri-state region 807 of the timing signal 804.

With reference to FIG. 7, the gating window 702 is transmitted to an "AND" gate 730 of the gating circuit 720, where an "AND" operation is performed between the gating window 702 and the timing signal 704. The output of the "AND" gate 730 comprises the filtered timing signal 728, which may be transmitted to a memory controller (not shown).

The control signal 716 is also transmitted from the timing control circuit 710 to the phase detector circuit 722, which may comprise a second delay module 732 and a second D-type flip flop 734. The second flip flop 734 is configured to receive as inputs the filtered timing signal 728 and a time-shifted control signal 736 from the second delay module 732. As illustrated in FIG. 8, the second delay module 732 may be used to create time-shifted control signal 808 such that a rising edge of the time-shifted control signal 808 is aligned temporally with the last falling edge 803 of the timing signal 804. The timeshift 810 performed by the second delay module 732 allows the second flip flop 734 to perform a phase detect operation, whereby a phase detect output value 738 of the second flip flop 734 indicates whether the rising edge of the time-shifted control signal 736 is early or late with respect to the last falling edge of the timing signal 704. In the example of FIGS. 7 and 8, the control signal pulse 802 is one-half clock period wide and the timeshift 810 is one-fourth clock period wide. The phase detect output value 738 may be low when the time-shifted control signal 736 is late and high when the time-shifted control signal 736 is early.

The phase detect output value 738 is sent to the counter 718 of the timing control circuit 710 to create a closed loop feedback circuit. As in FIG. 5, the delay value held by the counter 718 will be incremented or decremented based on whether the phase detect output value 738 is low or high. Through this feedback mechanism, the timing control circuit 710 is configured to delay propagation of the control signal 716 so as to track the last falling edge of the timing signal 704. When the closed-loop feedback circuit has caused the rising edge of the time-shifted control signal 736 to be timed sufficiently close to the last falling edge of the filtered timing signal 728, the phase detect output value 738 may oscillate between high and low values with each read request. When operating in this locked, oscillating manner, the last falling edge 803 of the timing signal 804 may occur near a middle of the control signal pulse 802, thus helping to ensure that the gating window 806 is closed.

FIG. 9 depicts signal timing diagrams for a circuit using a control signal pulse with a width of one full clock cycle. As described above with reference to FIG. 8, closing the gating window 902 may require that a last falling edge 903 of a timing signal 904 occurs contemporaneously with a control signal pulse 906. In FIG. 8, the control signal pulse 802 had a width of one-half of a clock cycle, and the time-shifted control signal 808 was shifted one-fourth of a clock cycle to enable tracking of the last falling edge 803 of the timing signal 804. In FIG. 9, by contrast, a wider control signal pulse 906 has a width of one full clock cycle, and a time-shifted control signal 908 is time-shifted one-half of a clock cycle 910. The wider control signal pulse 906 may be used in high jitter environments to help ensure that the control signal pulse 906 occurs during the last falling edge 903 of the timing signal 904. Allowing the control signal pulse 906 to be too wide, however, may result in early closing of the gating window 902 if the control signal pulse 906 is allowed to occur contemporaneously with a falling edge of the timing signal 904 that is not the last falling edge.

FIGS. 10A and 10B depict signal timing diagrams illustrating problems caused by early and late control signals. The signal timing diagrams of FIG. 10A relate to use of an open control signal to open a gating window. As described above with reference to FIGS. 5 and 6, a rising edge of the control signal used to open the gating window should ideally occur near a center of a preamble region of a timing signal. As illustrated in FIG. 10A, an early open control signal 1002 causing the gating window 1004 to open during the tri-state region may allow the tri-state region of the timing signal 1006 to enter into a memory controller. This may cause glitches triggering a false timing signal edge in the memory controller. Alternatively, a late open control signal 1008 causing the gating window 1010 to open after a first rising edge of the timing signal 1012 may clip the timing signal 1012 entering the memory controller, causing the memory controller to fail to correctly read an incoming data signal.

The signal timing diagrams of FIG. 10B relate to use of a close control signal to close a gating window. As described above with reference to FIGS. 7 and 8, a control signal to close the gating window should ideally occur contemporaneously with a last falling edge of the timing signal, such that the last falling edge occurs near a center of the control signal pulse. As illustrated in FIG. 10B, when the close control signal pulse is not aligned with the last falling edge of the timing signal 1014, 1016, either because the close control signal is too early 1018 or too late 1020, the gating window 1022, 1024 may not be closed. Thus, in both early 1018 and late 1020 control signal instances, the gating window 1022, 1024 left open may result in tri-state regions of the timing signal 1014, 1016 entering the memory controller.

Figure 11:
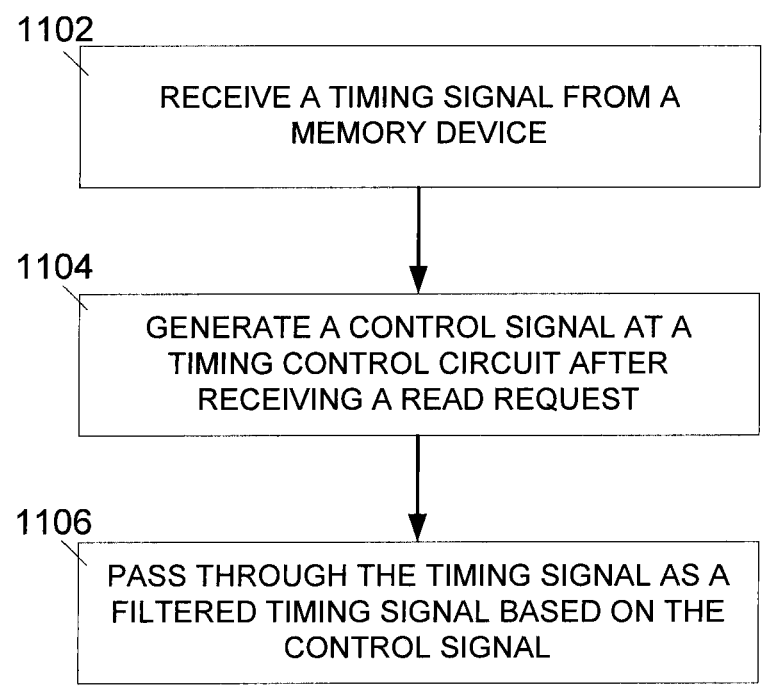
FIG. 11 depicts a flowchart illustrating a method for timing a read operation with a memory device.

FIG. 11 depicts a flowchart illustrating a method for timing a read operation with a memory device. At 1102, a gating circuit receives a timing signal from the memory device. At 1104, a timing control circuit generates a control signal after receiving a read request from a memory controller. The timing control circuit is configured to adjust the control signal to account for temporal variations in the timing signal. At 1106, the timing signal is passed through the gating circuit as a filtered timing signal during a gating window. The gating circuit is configured to generate the gating window based on the control signal.

It should be understood that the technology disclosed herein is described in detail with regards to performing read operations with a memory device. Furthermore, the technology is also applicable to other hardware, not involving memory devices, that utilize timing signals to transfer data from a responding node to a requesting node.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Further, as used in the description herein and throughout the claims that follow, the meaning of "each" does not require "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive of" may be used to indicate situations where only the disjunctive meaning may apply.

It is claimed:

1. A system for timing read operations with a memory device, the system comprising:
    a gating circuit configured to
        receive a timing signal from the memory device, and
        during a gating window, pass through the timing signal as a filtered timing signal, wherein the gating circuit generates the gating window based on a control signal;
    a timing control circuit configured to generate the control signal after receiving a read request from a memory controller, wherein the timing control circuit adjusts the control signal to account for temporal variations in the timing signal from the memory device; and
    a feedback circuit comprising
        the timing control circuit, and
        a phase detector circuit configured to (i) receive both the filtered timing signal and the control signal as inputs and (ii) send a phase detect output value to the timing control circuit.

2. The system of claim 1, wherein the feedback circuit is a closed-loop, self-adjusting system that automatically adjusts a timing of the control signal by tracking a timing of a rising edge or a falling edge of the timing signal.

3. The system of claim 2, wherein the timing of the control signal is adjusted to temporally align the control signal with the rising edge or the falling edge of the timing signal.

4. The system of claim 1, wherein the timing signal is a DQS strobe signal.

5. The system of claim 4,
    wherein the control signal is an open signal or a close signal configured to cause the gating window to open or close, respectively; and
    wherein the gating window is configured to eliminate tri-state regions of the DQS strobe signal in the filtered timing signal.

6. The system of claim 1, wherein the timing control circuit comprises:
    a signal generator configured to generate the control signal after receiving the read request; and
    a delay module configured to control a timing of the control signal based on a delay value held by a counter, wherein the counter is configured to increment or decrement the delay value based on the phase detect output value received from the phase detector circuit.

7. The system of claim 1, wherein the phase detector circuit comprises a D-type flip flop.

8. A system for timing read operations with a memory device, the system comprising:
    a gating circuit configured to
        receive a timing signal from the memory device, and
        during a gating window, pass through the timing signal as a filtered timing signal, wherein the gating circuit generates the gating window based on a control signal;
    a timing control circuit configured to generate the control signal after receiving a read request from a memory controller, wherein the timing control circuit adjusts the control signal to account for temporal variations in the timing signal from the memory device;

wherein the gating circuit comprises
- a D-type flip flop configured to receive the control signal and to output the gating window based on a timing of the control signal, and
- an "AND" gate configured to receive the gating window and the timing signal as inputs and to output the filtered timing signal.

9. The system of claim 8, wherein the temporal variations in the timing signal are based on clock jitter or changes in temperature or voltage in the system.

10. The system of claim 6, wherein the signal generator is a pulse generator; and wherein the control signal is a pulse signal.

11. A method for timing read operations with a memory device, the method comprising:
- receiving a timing signal from the memory device at a gating circuit;
- generating a control signal at a timing control circuit after receiving a read request from a memory controller, wherein the timing control circuit adjusts the control signal to account for temporal variations in the timing signal;
- passing through the timing signal as a filtered timing wherein the gating window is generated by the gating circuit based on the control signal;
- receiving the filtered timing signal and the control signal as inputs at a phase detector circuit; and
- sending a phase detect output value from the phase detector circuit to the timing control circuit based on the inputs, wherein the phase detector circuit and the timing control circuit comprise a feedback circuit.

12. The method of claim 11, further comprising:
- adjusting a timing of the control signal in the feedback circuit by tracking a timing of a rising edge or a falling edge of the timing signal, wherein the feedback circuit comprises a closed-loop, self-adjusting system.

13. The method of claim 12, wherein the adjusting step is configured to temporally align the control signal with the rising edge or the falling edge of the timing signal.

14. The method of claim 11, wherein the timing signal is a DQS strobe signal.

15. The method of claim 14,
wherein the control signal is an open signal or a close signal configured to cause the gating window to open or close, respectively; and wherein the gating window is configured to eliminate tri-state regions of the DQS strobe signal in the filtered timing signal.

16. The method of claim 11, further comprising:
- receiving the read request at a signal generator element of the timing control circuit, wherein the signal generator element is configured to generate the control signal in response to receiving the read request;
- incrementing or decrementing a delay value held by a counter based on the phase detect output value received from the phase detector circuit; and
- controlling a timing of the control signal based on the delay value, wherein a delay module element of the timing control circuit is configured to control the timing of the control signal.

17. The method of claim 11, wherein the phase detector circuit comprises a D-type flip flop.

18. A method for timing read operations with a memory device, the method comprising:
- receiving a timing signal from the memory device at a gating circuit;
- generating a control signal at a timing control circuit after receiving a read request from a memory controller, wherein the timing control circuit adjusts the control signal to account for temporal variations in the timing signal;
- passing through the timing signal as a filtered timing signal during a gating window, wherein the gating window is generated by the gating circuit based on the control signal;
- receiving the control signal at a D-type flip flop element of the gating circuit, wherein the flip flop element is configured to output the gating window based on a timing of the control signal; and
- performing an "AND" operation at an "AND" gate element of the gating circuit to output the filtered timing signal, wherein the "AND" gate is configured to receive the gating window and the timing signal as inputs for the "AND" operation.

19. The method of claim 18, wherein the temporal variations in the timing signal are based on clock jitter or changes in temperature or voltage in the memory device.

20. The method of claim 16,
wherein the signal generator element is a pulse generator; and
wherein the control signal is a pulse signal.

* * * * *